US008487705B2

(12) United States Patent
Yao et al.

(10) Patent No.: US 8,487,705 B2
(45) Date of Patent: Jul. 16, 2013

(54) PROTECTION CIRCUIT FOR RADIO FREQUENCY POWER AMPLIFIER

(75) Inventors: Jingshi Yao, Sunnyvale, CA (US); Peter Hu, Sunnyvale, CA (US); Xiaopeng Sun, Fremont, CA (US); Barry Jia-Fu Lin, Cupertino, CA (US); Mehra Mokalla, San Jose, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 96 days.

(21) Appl. No.: 13/115,024

(22) Filed: May 24, 2011

(65) Prior Publication Data

US 2011/0292554 A1    Dec. 1, 2011

Related U.S. Application Data

(63) Continuation-in-part of application No. 12/788,267, filed on May 26, 2010, now Pat. No. 8,164,389.

(51) Int. Cl.
*H02H 7/20* (2006.01)

(52) U.S. Cl.
USPC .......... 330/298; 330/207 P; 455/117; 361/101

(58) Field of Classification Search
USPC .............. 330/298, 207 P; 455/117; 361/101
See application file for complete search history.

(56) References Cited

U.S. PATENT DOCUMENTS

| | | | |
|---|---|---|---|
| 3,462,697 A * | 8/1969 | Gilbert | 330/9 |
| 3,526,846 A | 9/1970 | Campbell | |
| 3,974,438 A | 8/1976 | Alves, III | |
| 4,114,108 A | 9/1978 | Faulkenberry | |
| 4,737,733 A | 4/1988 | LaPrade | |
| 4,751,473 A | 6/1988 | Ono | |
| 4,821,000 A * | 4/1989 | Imanishi | 330/298 |
| 4,860,154 A * | 8/1989 | Fazlollahi | 361/101 |
| 5,392,464 A | 2/1995 | Pakonen | |
| 5,834,978 A | 11/1998 | Cho | |
| 6,215,987 B1 | 4/2001 | Fujita | |
| 6,850,119 B2 | 2/2005 | Arnott | |
| 7,145,397 B2 * | 12/2006 | Yamamoto et al. | 330/298 |
| 7,395,087 B2 | 7/2008 | Watanabe | |
| 7,486,144 B2 | 2/2009 | Mitzlaff | |
| 7,738,845 B2 | 6/2010 | Takahashi et al. | |
| 7,760,027 B2 * | 7/2010 | Murji et al. | 330/298 |
| 7,873,333 B2 | 1/2011 | Tanaka et al. | |
| 8,223,886 B2 | 7/2012 | Kitamura et al. | |
| 2006/0267688 A1 * | 11/2006 | Tanoue et al. | 330/278 |

OTHER PUBLICATIONS

Kim, Min-Gun, et al., "An FET-Level Linearization Method Using a Predistortion Branch FET," IEEE Microwave and Guided Wave Letters, vol. 9, No. 6, pp. 233-235, Jun. 1999.
Lee, C.P., et al., "Averaging and Cancellation Effect on High-Order Nonlinearity of a Power Amplifier," IEEE Transactions on Circuits and Systems—I: Regular Papers, vol. 54, No. 12, pp. 2733-2739, Dec. 2007.
Shifrin, M., et al.; "High Power Control Components Using a New Monolithic FET Structure," IEEE Microwave and Millimeter-Wave Monolithic Circuits Symposium; 1989.

(Continued)

*Primary Examiner* — Patricia Nguyen
(74) *Attorney, Agent, or Firm* — Schwabe Williamson & Wyatt

(57) ABSTRACT

Embodiments of circuits, apparatuses, and systems for a protection circuit to protect against overdrive or overvoltage conditions. Other embodiments may be described and claimed.

20 Claims, 7 Drawing Sheets

OTHER PUBLICATIONS

Maas, A.P.M., et al; "Set of X-Band Distributed Absorptive Limiter GaAs MIMICs;" Proceedings of the 4th European Radar Conference; Munich, Germany; Oct. 2007.

Pantellini, Alessio, et al.; "Performance Assessment of GaN HEMT Technologies for Power Limiter and Switching Applications;" Proceedings of the 5th European Microwave Integrated Circuits Conference; Paris, France, Sep. 27-28, 2010.

Non-Final Office Action in U.S. Appl. No. 12/788,267 mailed Oct. 12, 2011.

Notice of Allowance in U.S. Appl. No. 12/788,267 mailed Feb. 3, 2012.

Campbell, Charles F.; Notice of Allowance in U.S. Appl. No. 13/296,164 dated Jan. 29, 2013.

* cited by examiner

# PROTECTION CIRCUIT FOR RADIO FREQUENCY POWER AMPLIFIER

RELATED APPLICATION

This application is a continuation-in-part of U.S. application Ser. No. 12/788,267, titled "Overdrive Protection Circuit," filed May 26, 2010, the specification of which is hereby incorporated by reference in its entirety.

FIELD

Embodiments of the present disclosure relate generally to the field of circuits, and more particularly to a protection circuit for a radio frequency (RF) power amplifier.

BACKGROUND

Semiconductor devices used in radio frequency (RF) power amplifiers are limited by the power dissipation and voltage levels they can handle. RF power amplifiers can subject the transistors used therein to voltages and power levels that could cause failures under overdrive conditions. The transistor terminals that are subject to the most power stress are the output terminals. These are typically the collector in heterojunction bipolar transistor (HBT) processes and the drain in field-effect transistor (FET) processes, in common emitter and common source configurations, respectively. The failure mechanism is dominated by the breakdown of the collector-base junction or the drain-gate junction.

Improving the process to handle a greater breakdown margin is often difficult and may have tradeoffs that may not be desirable. To facilitate improvement of the breakdown issue, the problem may be addressed from a circuit point of view by circuits that detect and protect the main transistor or transistors of the power amplifier under overdrive conditions. In the past, most overdrive protection circuits were built based on the detection of output power or output current level, to control power supplies. This is complicated when implemented on a single chip.

The description in this section is related art, and does not necessarily include information disclosed under 37 C.F.R. 1.97 and 37 C.F.R. 1.98. Unless specifically denoted as prior art, it is not admitted that any description of related art is prior art.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
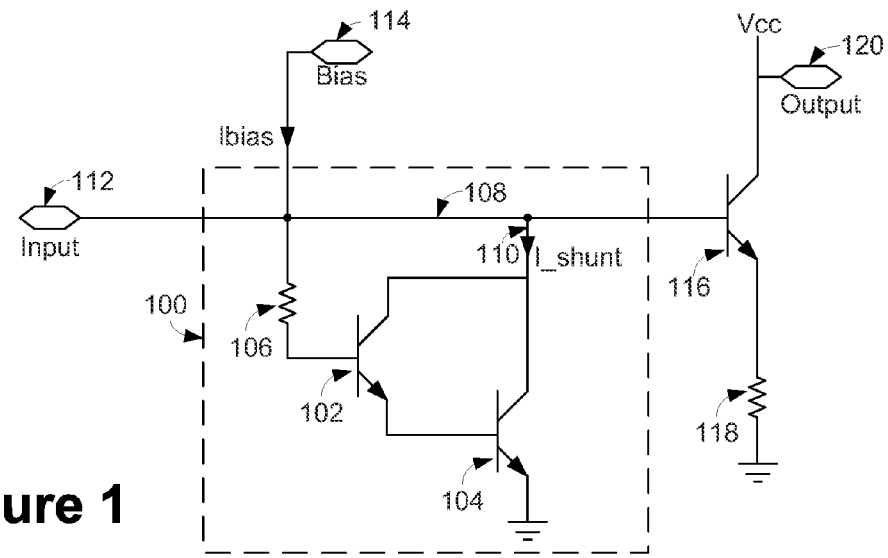
FIG. 1 is a schematic of an overdrive protection circuit, in accordance with various embodiments of the present disclosure.

FIG. 1 illustrates an overdrive protection circuit 100 to protect against RF input overdrive conditions in accordance with various embodiments of the present disclosure. The overdrive protection circuit 100 includes two transistors 102, 104, and a sensing resistor 106. As may be seen in FIG. 1, the two transistors 102, 104 are arranged in a Darlington configuration. The overdrive protection circuit 100 is coupled with a radio frequency (RF) transmission line 108 via the sensing resistor 106 and a shunt line 110. The RF transmission line 108 is coupled with an RF signal input source 112 that generates an RF signal, and is also coupled with a current source 114 that provides a base bias current Ibias. The RF signal input source 112 may be included within a transceiver. The RF transmission line 108 is coupled with a base of a primary power transistor 116 that serves as a power amplifier for the RF signal. The primary power transistor 116 is coupled with ground via a resistor 118 at its emitter, while its collector is coupled with an output node 120 and a collector supply bias Vcc that provides current Icc.

It is generally desirable for the coupling of the overdrive protection circuit 100 with the primary power transistor 116 to add as little parasitic effect to the overall circuit as possible. This may be facilitated by sizing the sensing resistor 106 in a manner such that an impedance provided by the overdrive protection circuit 100 is much larger than an impedance at the input of the primary power transistor 116. In general, in the embodiment of FIG. 1, the added impedance of the overdrive protection circuit 100 may generally be 8 to 20 times larger than the impedance at the input of the primary power transistor 116, so that performance of the primary power transistor 116 is not impacted. Practical values for the sensing resistor 106 can be, for example, in a range of 1 ohm to 100,000 ohms. The size of the sensing resistor 106 may also affect the turn-on power level, i.e., the power level at which the overdrive condition is detected and the overdrive protection circuit 100 turns on.

Limiting the parasitic effect of the overdrive protection circuit 100 may be further facilitated by the sizing and arrangement of the transistors 102, 104. As previously mentioned, the transistors 102, 104 are arranged in a Darlington configuration. When the transistor 102 is equal in size to the transistor 104, the Darlington configuration may reduce by half the effective added emitter-base capacitance of the transistors 102, 104, since the overdrive protection circuit 100 will have two emitter-base junction capacitances that are equal and arranged in series. The transistor 102 does not need to be equal to the transistor 104 in size, and further reduction in emitter-base capacitance may be achieved if desired by making the transistor 102 smaller than the transistor 104.

Most of the capacitance added by the overdrive protection circuit 100 may be provided by the collector-to-emitter capacitance of the transistor 104. Given that the transistors 102, 104 may only need to shunt a fraction of the RF input power and bias current that is handled by the primary power transistor 116, the collective area of the transistors 102, 104 may be smaller than the area of the primary power transistor 116, with respect to the chip space. Thus, the collector-to-emitter capacitance of the transistor 104 may be much smaller than the base-to-emitter capacitance of the primary power transistor 116. As an example, practical sizes for the transistors 102, 104 are generally 3 to 100 times smaller than the primary power transistor 116.

These impedance and capacitance characteristics of the overdrive protection circuit 100 work to limit the parasitic effect of the overdrive protection circuit 100. Under normal operating conditions, the overdrive protection circuit 100 may be substantially transparent, and the primary power transistor 116 may not generally degrade in performance. Under overdrive conditions, the overdrive protection circuit 100 turns on, shunting the bias current Ibias and input RF signal away from the primary power transistor 116, shown as I_shunt, via the shunt line 110. By shunting the input under overdrive conditions, the output power dissipation and peak collector voltage are significantly reduced, and the primary power transistor 116 is protected from breakdown and failure due to excessive power dissipation.

Figure 2:
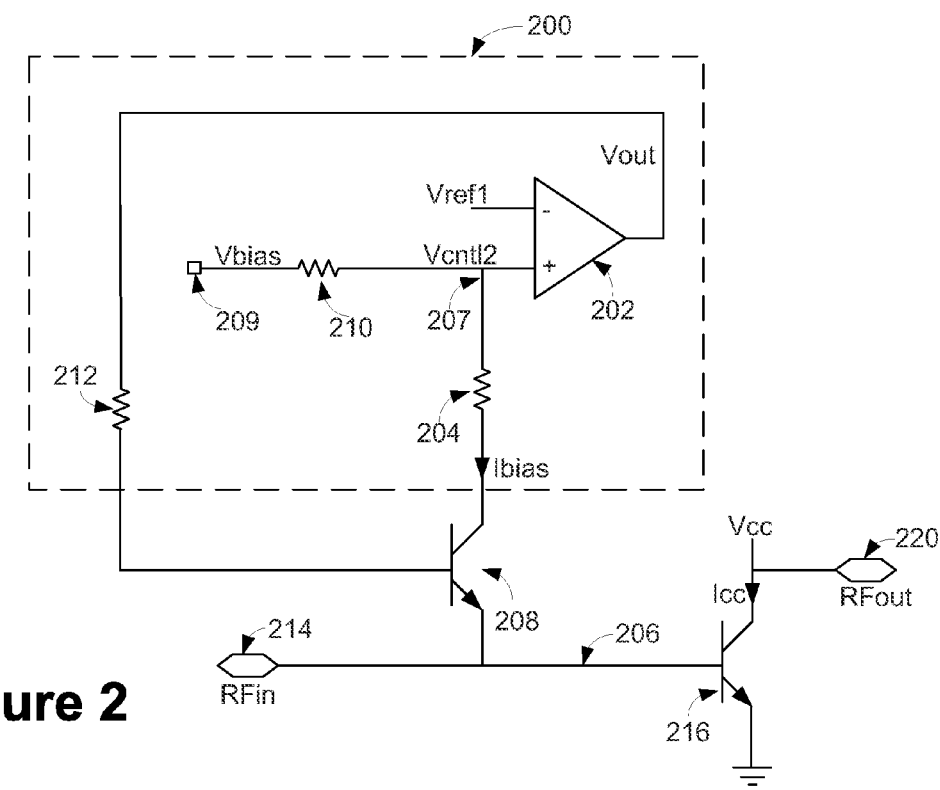
FIG. 2 is a schematic of another overdrive protection circuit, in accordance with various embodiments of the present disclosure.

FIG. 2 illustrates another overdrive protection circuit 200, in accordance with various embodiments of the present disclosure. The overdrive protection circuit 200 includes an operational amplifier 202 and a sensing resistor 204. The sensing resistor 204 is coupled with an RF transmission line 206 via a transistor 208, which serves as an emitter follower. The sensing resistor 204 is coupled with the operational amplifier 202 at the control voltage node 207, which is coupled via a resistor 210 with a bias voltage source 209 that provides a bias voltage Vbias. The output, Vout, of the operational amplifier 202 is coupled, via a resistor 212, with the base of the transistor 208. The RF transmission line 206 is coupled with an RF signal input source 214 that generates an RF signal, and to a base of a primary power transistor 216 that serves as a power amplifier. The RF signal input source 214 may be included within a transceiver. The primary power transistor 216 is coupled with ground at its emitter node, and a collector of the primary power transistor 216 is coupled with an output node 220 and a collector supply bias Vcc that provides current Icc.

The overdrive protection circuit 200 of FIG. 2 operates by setting the reference voltage Vref1 of the operational amplifier 202 to the control voltage Vcntl2 of the operational amplifier 202, whose value is determined by the maximum base bias current Ibias that flows through the sensing resistor 204 and turns off the base current of the transistor 208. As a result, the base bias current Ibias supplied to the primary power transistor 216 will be shut off under extreme cases of input overdrive, when the sensing resistor 204 senses an extremely high bias current Ibias flowing through it. As a result, the primary power transistor 216 is protected from overdrive conditions. The overdrive protection circuit 200 of FIG. 2 may be implemented on a chip that includes the primary power transistor 216.

Exemplary sizes for the transistor 208 are 3 to 100 times smaller than the size of the primary power transistor 216. Exemplary values for the reference resistor 212 are 100 to 100,000 ohms. The resistor 210 and the sensing resistor 204 are generally selected such that their ratio maintains a control voltage Vcntl2 that is more than reference voltage Vref1 during normal operation of the overdrive protection circuit 200.

In accordance with various embodiments of the present disclosure, the control voltage Vcntl2 and biasing current Ibias may be governed by the following equations:

$$Vcntl2 = Ibias \times Rsense + Vce + Vbe; \text{ and} \quad\quad 1\text{-}1$$

$$Ibias = Icc/Beta; \quad\quad 1\text{-}2$$

where Icc is the targeted maximum operating current of primary power transistor 216; Beta is the direct current (DC) current gain of the primary power transistor 216; Rsense is a value of the sensing resistor 204 and can be 1 ohm to approximately 10,000 ohms depending on targeted Icc; and Vce+Vbe may be approximately equal to 1.5V for HBT, where Vce is the voltage across the collector-emitter of the transistor 208, and Vbe is the voltage across the base-emitter of the primary power transistor 216.

The passive component R_210 of resistor 210 can be determined by $$R\_210 = (Vbias - Vcntl2)/Ibias \quad\quad 2\text{-}1$$

The reference voltage Vref1 is the same as the control voltage Vcntl2, by definition of an operation amplifier, i.e., Vref1=Vcntl2. Passive component R_212 of the resistor 212 can be determined based on the quiescent current Icq of the primary power transistor 216, by the following two equations:

$$Iref2 = (Beta\_216 * Beta\_208)/Icq; \text{ and} \quad\quad 3\text{-}1$$

$$R\_212 = (Vout - 2*Vbe)/Iref2; \quad\quad 3\text{-}2$$

where Iref2 is the current through the resistor 212; Beta_208 is DC current gain through the transistor 208 under large signal, and Beta_216 is the DC current gain through the transistor 216 under large signal.

Figure 3:
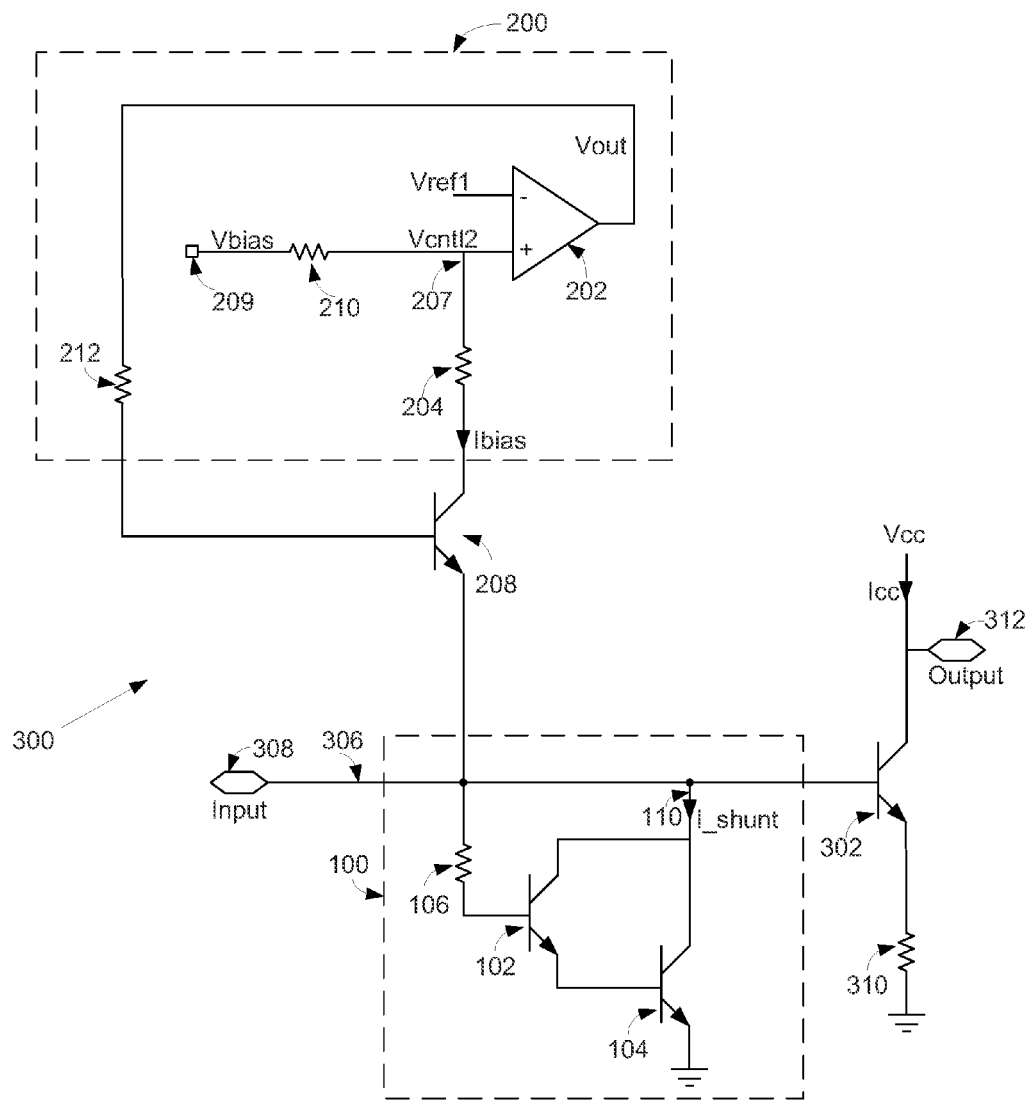
FIG. 3 is a schematic of an overdrive protection circuit that combines the overdrive protection circuits in FIGS. 1 and 2, in accordance with various embodiments of the present disclosure.

FIG. 3 illustrates the overdrive protection circuits 100, 200 of FIGS. 1 and 2 in an arrangement resulting in an overdrive protection circuit 300 where both overdrive protection circuits 100, 200 are used to protect the primary power transistor 302 that serves as a power amplifier. Like reference numerals in FIG. 3 represent like elements from FIGS. 1 and 2. As may be seen, both overdrive protection circuits 100, 200 are coupled with an RF signal transmission line 306, which extends between RF input source 308 that generates an RF signal and the base of the primary power transistor 302. The RF signal input source 308 may be included within a transceiver. The primary power transistor 302 is coupled with ground via a resistor 310 at its emitter, while its collector is coupled with an output node 312 and to a collector supply bias Vcc that provides current Icc. Since the overdrive protection circuits 100, 200 each have their own overdrive protection range, the overall protection range may be further extended by combining the two overdrive protection circuits 100, 200. By carefully selecting the values of the sensing resistors 106, 204 for each overdrive protection circuit 100, 200, one of the overdrive protection circuits can be activated when the other overdrive protection circuit reaches the limit of its protection range.

Accordingly, embodiments of the present invention provide several approaches that protect power amplifiers from overdrive conditions, while being transparent under normal drive conditions. The circuit arrangements disclosed herein may be implemented on a chip that includes the RF signal input and the power amplifier. The added cost based upon area used on the chip is generally small, and therefore, the benefits of adding an overdrive protection circuit in accordance with the present disclosure generally outweighs any cost impacts. Additionally, the combination of the two overdrive protection circuits 100, 200, as illustrated and described in overdrive protection circuit 300 of FIG. 3, presents a dynamically changing biasing circuit whose power added efficiency at saturation is improved significantly without sacrificing linearity.

Figure 4:
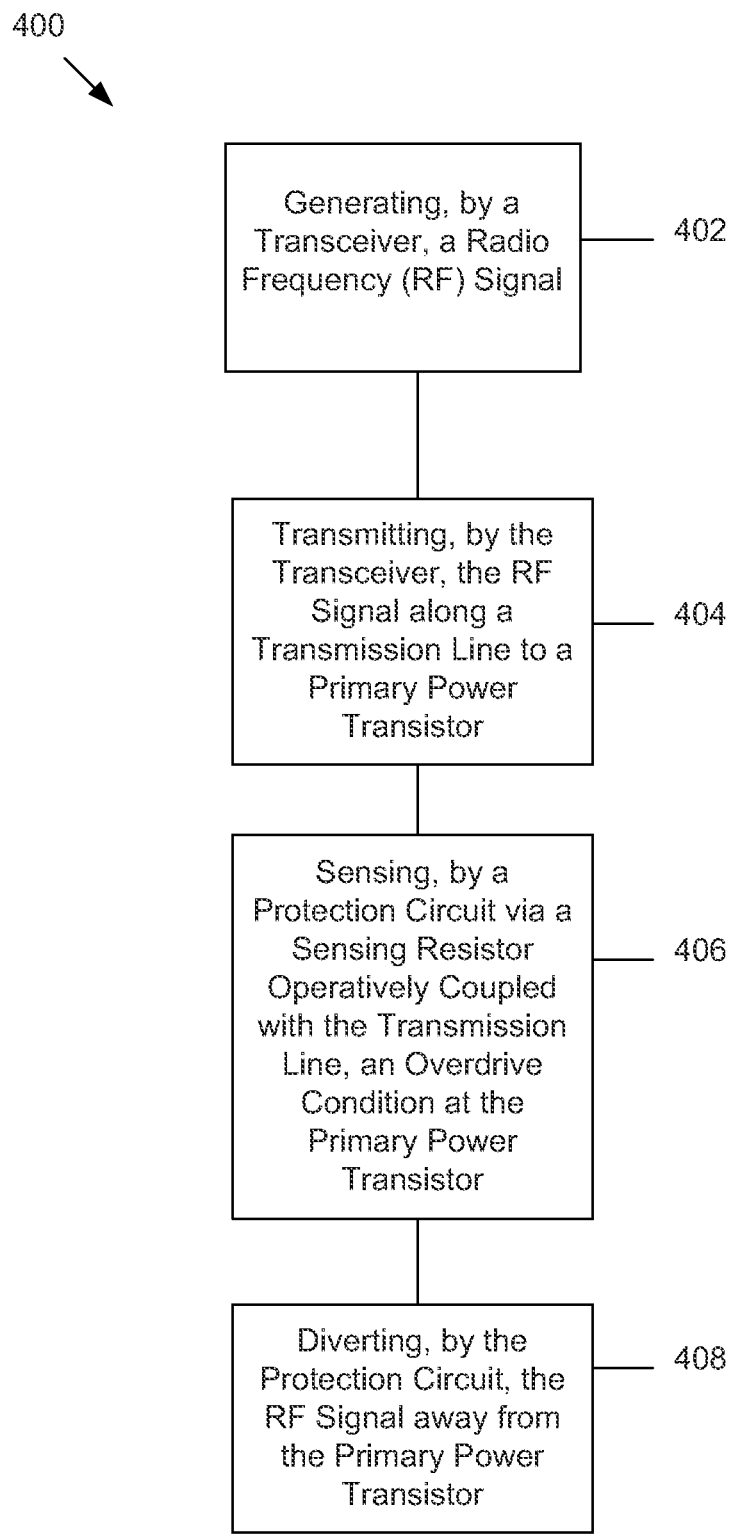
FIG. 4 is a flowchart illustrating various steps of a method, in accordance with various embodiments of the present disclosure.

FIG. 4 illustrates an exemplary method 400 of operation of the overdrive protection circuits 100, 200 and/or 300, in accordance with various embodiments. At 402, an RF signal is generated by a transceiver. At 404, the RF signal is transmitted, by the transceiver, along a transmission line to a primary power transistor. At 406, an overdrive condition is sensed by a protection circuit via a sensing resistor operatively coupled with the transmission line. At 408, the RF signal is diverted away from the primary power transistor by the protection circuit. In accordance with various embodiments, the diverting is achieved by shunting the RF signal. In accordance with various embodiments, the diverting is achieved by turning off a base bias current of the primary power transistor.

While the present invention has been described with reference to HBT technology, those skilled in the art will understand that other bipolar technologies such as, for example, bipolar junction transistor (BJT), FET, and BiCMOS (combination of BJT and complementary-metal-oxide-semiconductor) technologies would also benefit from overdrive protection circuits as described herein.

While the above embodiments describe overdrive protection circuits that are configured to protect an RF power amplifier from RF input overdrive conditions, protection circuits may be configured to additionally/alternatively serve other functions desirable for operation of the RF power amplifier. For example, protection circuits may be configured to protect the RF power amplifier from DC overvoltage conditions in both input and output, to protect an RF power amplifier under mismatch conditions, and/or to improve linearity of the RF power amplifier; in addition to protecting against RF input overdrive conditions in a manner similar to that describe above. Protection circuits may further be configured to provide various efficiency improvements as will be described.

Figure 5:
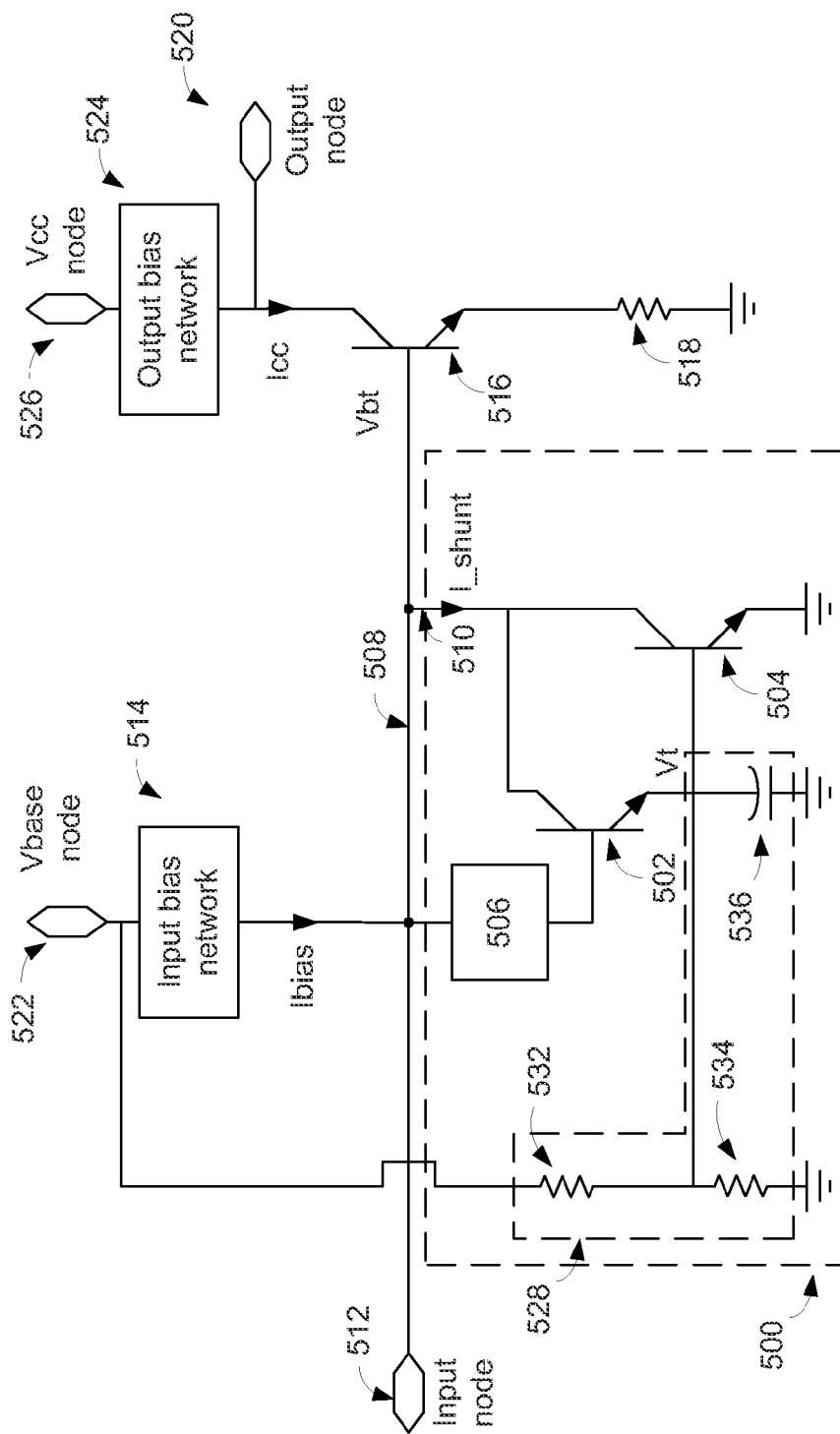
FIG. 5 is a schematic of a protection circuit, in accordance with various embodiments of the present disclosure.

FIG. 5 illustrates a protection circuit 500 in accordance with various embodiments of the present disclosure. The protection circuit 500 includes two transistors 502, 504, arranged in a Darlington configuration, and a compensator 506. The compensator 506 replaces the sensing resistor shown in the overdrive protection circuits described above. The compensator 506 may act as an RF amplitude and/or phase compensation circuit. In some embodiments, when the compensator 506 is to act solely/primarily as an RF amplitude compensator to reduce the RF amplitude to compensate for the smaller size of the transistor 502 as compared to a primary power transistor 516, the compensator 506 may simply include a resistor, as shown in the above-described embodiments. Phase compensation may be desired in some embodiments to increase linearity of the response profile of the primary power transistor 516. The compensator 506 may, therefore, include additional/alternative components to provide desired phase compensation in such embodiments. For example, the compensator 506 may include a resistor coupled in parallel with a capacitor to provide both RF amplitude and phase compensation.

The protection circuit 500 is coupled with an RF transmission line 508 via the compensator 506 and a shunt line 510. The RF transmission line 508 is coupled with an input node 512 that provides an RF signal, and is also coupled with a current source, such as input bias network 514, that provides a base bias current Ibias. The input bias network 514 may be coupled with a base bias voltage (Vbase) node 522. The RF transmission line 508 is further coupled with a base of the primary power transistor 516 that serves as a power amplifier for the RF signal. The primary power transistor 516 is coupled with ground via a resistor 518 at its emitter, while its collector is coupled with an output node 520 and an output bias network 524 that provides collector supply current, Icc. The output bias network 524 is coupled with a Vcc node 526.

While the input bias network 514 and the output bias network 524 were not explicitly shown in FIGS. 1, 2, and 3, it will be understood that these networks may be included in the circuits of said figures without changing the operation of the overdrive protection circuits described therein.

The protection circuit 500 further includes a detector 528 that is coupled with the Vbase node 522, an emitter of transistor 502, and a base of transistor 504. The detector 528 may be configured to detect overvoltage conditions. As shown, the detector 528 may be configured to detect an overvoltage condition by detecting voltage levels of trigger voltage, e.g., Vbase, through a voltage divider including resistors 532, 534. In other embodiments, additional/alternative components may be used to detect voltage levels. For example, in one embodiment, the detector 528 may include a diode chain.

The detector 528 may track the trigger voltage, e.g., Vbase, and provide a biasing voltage, Vt, for transistors 502, 504. Vt will increase proportionally with Vbase. When Vt is high enough, i.e., when Vt is greater than a predetermined voltage, transistor 504 will be turned on, which may, in turn, pulldown a base voltage, Vbt, of primary power transistor 516. Vbt may remain low while the transistor 504 is turned on. A low Vbt may shut off the primary power transistor 516 so that little- to no-current flows through the primary power transistor 516. The ratio between resistors 532 and 534 may be designed for the desired overvoltage protection level.

The protection circuit 500 may further protect the primary power transistor 516 from an RF overdrive and/or overvoltage condition. With an RF signal at the input node 512, the RF voltage may be distributed among compensator 506 and the two base-emitter junctions of transistors 502, 504, depending on their impedance level. Under normal RF operation, the RF voltage will not be high enough to turn on either transistor 502 or transistor 504. The transistors 502, 504 are much smaller than the primary power transistor 516 to reduce the loading effect, as discussed above. Therefore, the protection circuit 500 is transparent to the primary power transistor 516 at normal input levels. As the drive level of the RF signal increases, the voltage at transistor 502 or transistor 504 may be high enough to turn either or both of them on. Under such condition, transistor 502 and/or transistor 504 provide a current path at the input of the primary power transistor 516. By shunting the input current under such RF overdrive and/or overvoltage conditions, Vbt is pulled down low, as is Icc. The output power dissipation and peak collector voltage may also be significantly reduced and the primary power transistor 516 may be protected from breakdown and failure due to excessive power dissipation. The impedance of compensator 506, size of transistors 502, 504, and value of capacitor 536 may determine the voltage distribution at the input. Thus, their values determine the level of input RF power that turns on the protection circuit 500. The biasing voltage Vt may also play an important role in determination of the RF input power level for the protection circuit 500 to operate. Therefore, the protection circuit 500 provides significant design freedom to achieve desired protection power level and facilitates addition of power amplifier products with different process, power level, and circuit configurations.

The reduction of Icc by the protection circuit 500 will not negatively affect linearity of the primary power transistor 516 as the reduction will only occur when the primary power transistor 516 is operating close to its saturation power. On the contrary, the protection circuit 500 may improve the linearity of the response profile of the primary power transistor 516 due, at least in part, to a very low level of third order nonlinearities generated by the transistor 502. These nonlinearities may be amplified by the primary power transistor 516 and operate to cancel at least a portion of the nonlinearities generated by the primary power transistor 516. The amount of cancellation may be adjusted by the sizing of transistors 502, 504, components of the compensator 506, and the capacitor 536.

Figure 6:
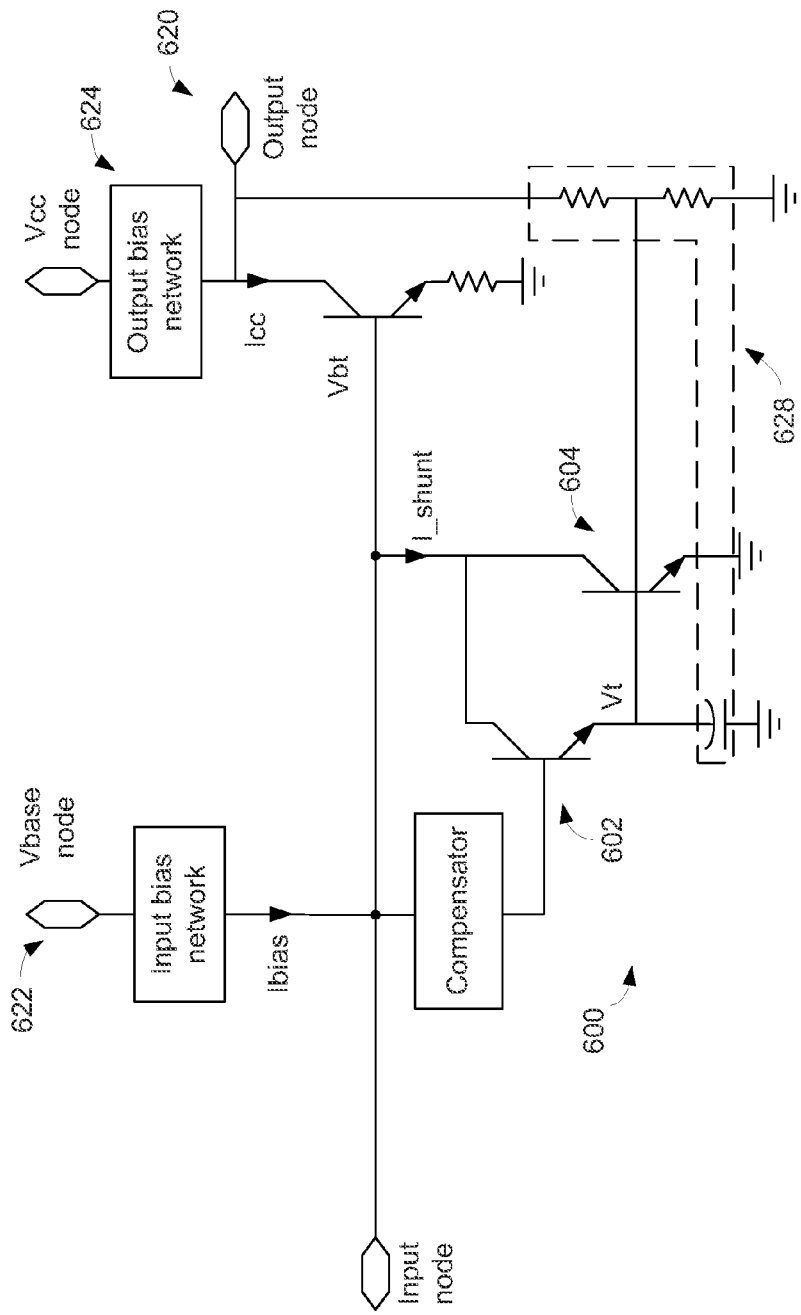
FIG. 6 is a schematic of another protection circuit, in accordance with various embodiments of the present disclosure.

FIG. 6 illustrates a protection circuit 600 in accordance with various embodiments of the present disclosure. The protection circuit 600 may be similar to protection circuit 500, with similar components being substantially interchangeable; however, the protection circuit 600 may include a detector 628 coupled with an output bias network 624, rather than being coupled with Vbase node 622. In a manner similar to that described above, the detector 628 may track a trigger voltage and provide a proportional biasing voltage, Vt, for transistors 602, 604. However, in this embodiment, the trigger voltage may be the collector supply bias Vcc, rather than Vbase.

The protection circuit 600 may operate to provide DC overvoltage protection, RF overvoltage protection, and increased linearity similar to protection circuit 500. The protection circuit 600 may provide further robustness by protecting the primary power transistor 616 in case of mismatch conditions by effect of the protection circuit 600 being coupled directly with output node 620.

Under a mismatch condition, an output of the primary power transistor 616 may be subject to impedance of arbitrary magnitude and phase. As a result, voltage and current at the output node 620 may have much higher peaks than with a matched load. For certain voltage standing wave form ratio (VSWR) levels, a device may fail at any phase depending on if either the voltage or current touch a safe operation area (SOA) curve. The protection circuit 600 may limit both peak current and peak output voltage, thereby improving operation under a mismatch condition.

Figure 7:
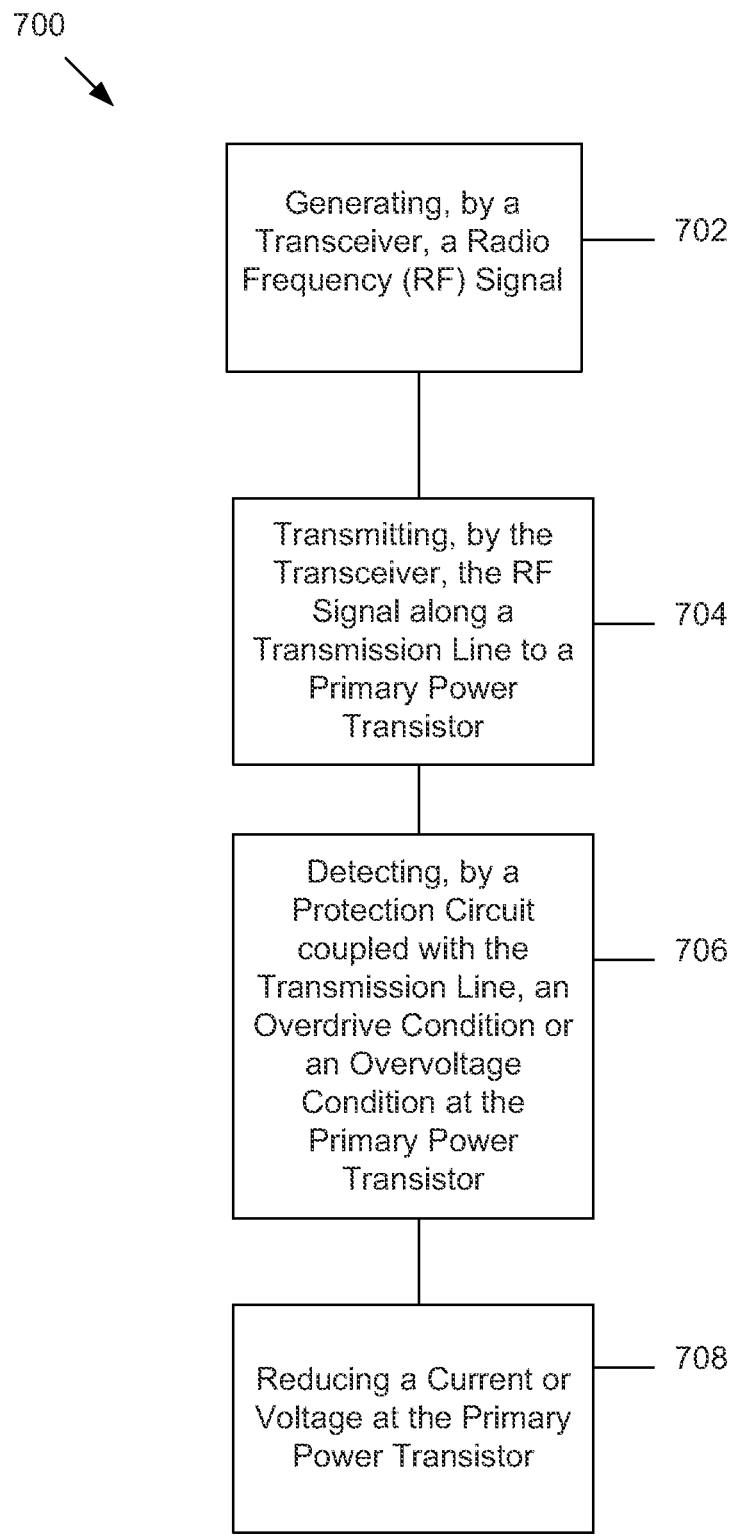
FIG. 7 is a flowchart illustrating various steps of a method, in accordance with various embodiments of the present disclosure.

FIG. 7 illustrates an exemplary method 700 of operation of the protection circuits 100, 200, 300, 500, and/or 600, in accordance with various embodiments. At 702, an RF signal is generated by a transceiver. At 704, the RF signal is transmitted, by the transceiver, along a transmission line to a primary power transistor. At 706, an overdrive or overvoltage condition is detected by a protection circuit coupled with the transmission line. In some embodiments, the protection circuit may be capable of detecting both overdrive and overvoltage conditions. In accordance with various embodiments, the detecting of an overvoltage condition may be done by a detector of the protection circuit providing a bias voltage, which is proportional to a trigger voltage, to transistors of the protection circuit. At 708, the protection circuit may reduce a current or voltage at the primary power transistor in the event an overdrive or overvoltage condition is detected. In accordance with various embodiments, the reduction is achieved by shunting the RF signal and/or DC biasing.

Figure 8:
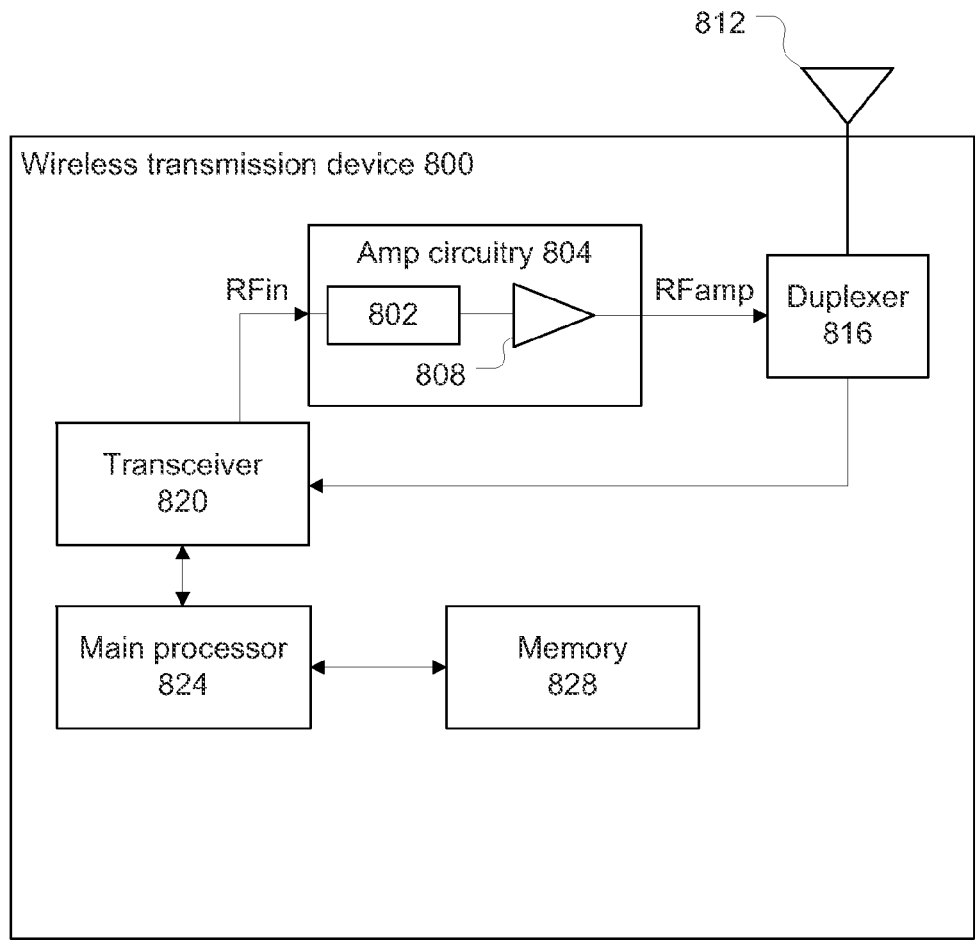
FIG. 8 illustrates a wireless transmission device implementing an overdrive protection circuit, in accordance with at least some embodiments of the present disclosure.

The protection circuits 100, 200, 300, 500, and/or 600 may be incorporated into any of a variety of apparatuses and systems. A block diagram of an exemplary wireless transmission device 800 incorporating one of the overdrive protection circuits 100, 200, 300, 500, and/or 600 (represented by 802) into amplification circuitry 804 that includes a power amplifier 808 is illustrated in FIG. 8. In addition to the amplification circuitry 804, the wireless transmission device 800 may have an antenna structure 812, a duplexer 816, a transceiver 820, a main processor 824, and a memory 828 coupled with each other at least as shown. While the wireless transmission device 800 is shown with transmitting and receiving capabilities, other embodiments may include wireless transmission devices without receiving capabilities.

In various embodiments, the wireless transmission device 800 may be, but is not limited to, a mobile telephone, a paging device, a personal digital assistant, a text-messaging device, a portable computer, a desktop computer, a telecommunications base station, a subscriber station, an access point, a radar, a satellite communication device, or any other device capable of wirelessly transmitting RF signals.

The main processor 824 may execute a basic operating system program, stored in the memory 828, in order to control the overall operation of the wireless transmission device 800. For example, the main processor 824 may control the reception of signals and the transmission of signals by transceiver 820. The main processor 824 may be capable of executing other processes and programs resident in the memory 828 and may move data into or out of memory 828, as desired by an executing process.

The transceiver 820 may receive outgoing data (e.g., voice data, web data, e-mail, signaling data, etc.) from the main processor 824, may generate the RFin signal to represent the outgoing data, and provide the RFin signal to the amplification circuitry 804.

The amplification circuitry 804 may amplify the RFin signal in accordance with a selected amplification mode. The amplified RFamp signal may be forwarded to the duplexer 816 and then to the antenna structure 812 for an over-the-air (OTA) transmission.

In a similar manner, the transceiver 820 may receive an incoming OTA signal from the antenna structure 812 through the duplexer 816. The transceiver 820 may process and send the incoming signal to the main processor 824 for further processing.

In various embodiments, the antenna structure 812 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 800 is given by way of example and that, for simplicity and clarity, only so much of the construction and operation of the wireless transmission device 800 as is necessary for an understanding of the embodiments is shown and described. Various embodiments contemplate any suitable component or combination of components performing any suitable tasks in association with wireless transmission device 800, according to particular needs. Moreover, it is understood that the wireless transmission device 800 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
    a transmission line configured to transmit a radio frequency (RF) signal;
    a primary power transistor having a base coupled with the transmission line, wherein the primary power transistor is configured to amplify the RF signal; and
    a protection circuit coupled with the transmission line and configured to detect an overdrive or overvoltage condition and to reduce a current or voltage at the power amplifier based on a detection of the overdrive or overvoltage condition,
    wherein the protection circuit includes:
        a compensator configured to compensate for an amplitude or phase of the RF signal; and
        two transistors coupled with the transmission line via the compensator and a shunt line.

2. The circuit of claim 1, wherein the two transistors are arranged in a Darlington configuration.

3. The circuit of claim 1, wherein the compensator is configured to compensate for the phase of the RF signal to increase linearity of a response profile of the primary power transistor.

4. The circuit of claim 1, wherein the protection circuit further comprises:
    a detector configured to track a trigger voltage and to provide a biasing voltage to the two transistors that is proportional to the trigger voltage.

5. The circuit of claim 4, wherein the detector comprises a voltage divider coupled with an emitter of a first transistor of the two transistors and further coupled with a base of a second transistor of the two transistors.

6. The circuit of claim 5, wherein the detector further comprises:
    a capacitor coupled with the emitter of the first transistor.

7. The circuit of claim 4, wherein the detector is coupled with a bias voltage node that is configured to provide a bias voltage, through an input bias network, to the base of the primary power transistor.

8. The circuit of claim 4, wherein the detector is coupled with a control voltage node that is configured to provide a bias voltage, through an output bias network, to a collector of the primary power transistor.

9. A circuit comprising:
    a transmission line configured to transmit a radio frequency (RF) signal;
    a primary power transistor having a base coupled with the transmission line, wherein the primary power transistor is configured to amplify the RF signal; and
    a protection circuit coupled with the transmission line and configured to detect an overdrive or overvoltage condition and to reduce a current or voltage at the power amplifier based on a detection of the overdrive or overvoltage condition,
    wherein the protection circuit is coupled with the transmission line via an emitter follower;
    wherein the protection circuit further comprises an operational amplifier;
    wherein the sensing resistor is coupled with a voltage control node of the operational amplifier and is coupled with the transmission line via a collector of the emitter follower; and
    wherein an output of the operational amplifier is coupled with a base of the emitter follower.

10. A system comprising:
    a transceiver configured to provide a radio frequency (RF) signal;
    amplification circuitry coupled with the transceiver, the amplification circuitry including a primary power transistor configured to receive and amplify the RF signal;
    a transmission line configured to transmit the RF signal from the transceiver to a base of the primary power transistor; and
    a protection circuit coupled with the transmission line and configured to detect an overdrive or overvoltage condition and to reduce a current or voltage at the primary power transistor based on a detection of the overdrive or overvoltage condition,
    wherein the protection circuit includes:
        a compensator configured to compensate for an amplitude or phase of the RF signal; and
        two transistors coupled with the transmission line via the compensator and a shunt line.

11. The system of claim 10, wherein the protection circuit further comprises:
    a detector configured to track a trigger voltage and to provide a biasing voltage to the two transistors that is proportional to the trigger voltage.

12. The system of claim 11, wherein the detector comprises a voltage divider coupled with an emitter of a first transistor of the two transistors and further coupled with a base of a second transistor of the two transistors.

13. The system of claim 12, wherein the detector further comprises:
    a capacitor coupled with the emitter of the first transistor.

14. The system of claim 11, wherein the detector is coupled with a voltage node that is configured to provide a bias voltage through an input bias network to the base of the primary power transistor or through an output bias network to a collector of the primary power transistor.

15. A method comprising:
   generating, by a transceiver, a radio frequency (RF) signal;
   transmitting, by the transceiver, the RF signal along a transmission line to a primary power transistor;
   detecting, by a protection circuit coupled with the transmission line, an overdrive condition or an overvoltage condition, wherein said detecting includes:
      tracking, with a detector of the protection circuit, a trigger voltage; and
      providing a biasing voltage to two transistors of the protection circuit that is proportional to the trigger voltage; and
   reducing, by the protection circuit, a current or voltage at the primary power transistor based on said detecting.

16. The method of claim 15, wherein said reducing comprises shunting at least a portion of the RF signal via the protection circuit.

17. The method of claim 15, further comprising:
   compensating, with the protection circuit, for a phase of the RF signal to increase linearity of a response profile of the primary power transistor.

18. A system comprising:
   a transceiver to:
      generate a radio frequency (RF) signal;
      transmit the RF signal along a transmission line to a primary power transistor;
   a protection circuit coupled with the transmission line to detect an overdrive condition or an overvoltage condition, wherein the protection circuit includes:
      two transistors; and
      a detector to track a trigger voltage and to provide a biasing voltage to the two transistors of the protection circuit that is proportional to the trigger voltage,
   wherein the protection is further to reduce a current or voltage at the primary power transistor based on said detecting.

19. The system of claim 18, wherein the protection circuit is to reduce the current or voltage by shunting, through the two transistors at least a portion of the RF signal.

20. The system of claim 18, wherein the protection circuit further comprises:
   a compensator to compensate for a phase of the RF signal to increase linearity of the primary power transistor.

* * * * *